United States Patent [19]

Martin et al.

[11] Patent Number: 4,535,012

[45] Date of Patent: Aug. 13, 1985

[54] FAST CURING SOLDERABLE CONDUCTOR

[75] Inventors: F. Wayne Martin, Baldwin Place; Samson Shahbazi, Yonkers; Ronald J. Schoonejongen, Carmel, all of N.Y.

[73] Assignee: Electro Materials Corp. of America, Mamaroneck, N.Y.

[21] Appl. No.: 537,735

[22] Filed: Sep. 30, 1983

[51] Int. Cl.³ ............................................. B05D 3/02
[52] U.S. Cl. ................................ 427/386; 427/388.1; 427/388.4; 427/388.5; 427/96; 252/514
[58] Field of Search ................ 252/514; 427/96, 386, 427/388.1, 388.4, 388.5; 524/439

[56] References Cited

U.S. PATENT DOCUMENTS

| 2,321,587 | 6/1943 | Davie et al. | 117/6 |
|---|---|---|---|
| 3,412,043 | 11/1968 | Gilliland | 252/514 |
| 3,666,689 | 5/1972 | Groszek et al. | 252/512 |
| 3,746,662 | 7/1973 | Adelman | 252/513 |
| 3,767,519 | 10/1973 | Kojima et al. | 161/168 |
| 4,327,124 | 4/1982 | DesMarais, Jr. | 427/96 |
| 4,353,816 | 10/1982 | Iwasa | 252/512 |
| 4,371,459 | 2/1983 | Nazarenko | 252/514 |
| 4,410,457 | 10/1983 | Fujimura et al. | 252/508 |

FOREIGN PATENT DOCUMENTS

| 2938465 | 4/1981 | Fed. Rep. of Germany | 252/514 |
|---|---|---|---|
| 0102930 | 9/1978 | Japan | 252/514 |

*Primary Examiner*—Josephine L. Barr

[57] ABSTRACT

A solderable electrically conductive composition includes metallic silver particles embedded in a matrix of carboxylated vinyl and epoxy. The composition is formed by dissolving the vinyl in a solvent to form a solution. The solution is then mixed with the metallic silver particles and the epoxy to form an ink which is applied to a substrate to form a film thereon. The film is cured to evaporate the solvent and allow polymerization to occur thereby leaving a solderable electrically conductive film, formed from metallic silver particles embedded in a matrix of vinyl and epoxy, on the substrate.

18 Claims, No Drawings

FAST CURING SOLDERABLE CONDUCTOR

The invention relates to the field of conductive films and more particularly to a solderable electrically conductive silver polymer film having a relatively short cure time.

Conductive polymer films are well known, and used in connection with printed circuits to connect the elements of the circuits and to provide an electrical connection to other circuits. Most of these conductive polymer films contain noble metals such as silver or gold to render them conductive.

Typically, the films are applied to a substrate, such as a circuit board, by silk screening methods and then cured. Average cure times for most conductive polymer films range from one to two hours. Present conductive polymer film will not accept solder and require the application of a plated metal surface which is solderable. The plated metal surface may be applied by either electroless or electroplate techniques. Electrical connections may then be made to the conductive film by soldering the electrical leads to the plated metal surface. Soldering must be performed very carefully as the conductive polymer films containing silver are subject to leaching. Specifically, during the application of solder the silver particles tend to be dissolved in the solder and run off the substrates, rendering the substrate unusuable.

The plating of presently available conductive polymer films is required to render them solderable. The plating currently applied to most conductive polymer films is an electroless bath of either nickel boron or nickel phosphorus. Plating, however, is inconvenient on a small scale and presents major problems where substantial production of plated conductive polymer films (such as in printed circuit boards) is contemplated. For example, electroless nickel plating of conductive polymer films on a volume production basis requires the establishment of a suitable plating facility which is a large, expensive and complicated venture. Specifically, the plating room must have a suitable quantity and quality of ventilation and the various levels of air flow must be controlled. The tanks used for plating should be formed from fiberglass, polyproplyene, polyethylene or other suitable high temperature resistant (200° F. range) material. The tanks must also be capable of withstanding nitric acid cleaning on a periodic basis. In addition, a holding tank and a transfer system is required to empty and refill the plating tank when nickel salts reach a certain concentration requiring that the tank be purged. Low watt density immersion heaters made of quartz or passivated stainless steel are necessary to provide the appropriate level of heat. The use of immersion heaters require agitation by forced air impinging directly on the heaters to avoid localized heating. Jacketed tanks may be used in place of the immersion heaters but vigorous agitation is required in any case. The use of non-metallic or other acid resistant products is recommended. Continuous filtration of the plating bath must be performed each day. A polypropylene cartridge filter is recommended, which filter should be purged with hot water and the cartridge filter changed 6 to 10 times per hour for continuous filtration. Of course, the continuous filtration requires a pump suitable for continuous operation at 200° F.

It will readily be appreciated that a solderable conductive film would eliminate the need for the entire plating operation described above and is therefore highly desirable. In addition, a solderable conductive film in which the conductive particles are resistent to leaching would also be desirable. Further, a solderable conductive film which may be cured in a matter of minutes would be most desirable.

Accordingly, one object of the present invention is to provide an electrically conductive polymer film which is solderable.

Another object of the present invention is to provide an electrically conductive film which is solderable without the application of a plated metal surface or any other subsequent coating operation.

Still another object of the present invention is to provide an electrically conductive film which is solderable by any standard soldering technique.

A further object of the present invention is to provide a solderable electrically conductive film in which the conductive particles will not leach off the substrate during normal soldering.

A still further object of the present invention is to provide a solderable film which is highly electrically conductive.

An additional object of the present invention is to provide a solderable electrically conductive film having a curing time which is shorter than curing times of conductive polymer films of the prior art.

An additional object of the present invention is to provide a electrically conductive solderable film in which the solder coverage of the film is greater than the coverage achieved with conductive polymer films of the prior art.

In accordance with the present invention a solderable electrically conductive composition includes metallic silver particles embedded in a matrix of vinyl and epoxy. The composition is formed by dissolving the vinyl in a solvent to form a solution. The solution is then mixed with the metallic silver particles and the epoxy to form an ink which is applied to a substrate to form a film thereon. The film is cured to evaporate the solvent and allow polymerization to occur thereby leaving a solderable electrically conductive film, formed from metallic silver particles embedded in a matrix of vinyl and epoxy, on the substrate.

The solderable electrically conductive composition of the present invention is made up of metallic silver particles embedded in a matrix formed from carboxylated vinyl and a moderate chain length epoxy. The composition is formed by dissolving the carboxylated vinyl powder in a solvent to form a solution. Ester alcohol sold under the trademark Texanol by Eastman Kodak may be used as the solvent. Once the carboxylated vinyl is dissolved within the solvent the metallic silver particles and the epoxy are added to the solution. The silver particles may be in either a granular powder or flake form, with a typical particle size of 1 to 10 microns. The epoxy may be any moderate chain length epoxy such as that sold by London Chemical Co. under the trademark Lonco PC No. 549 Solder Resist or that sold by MacDermid Inc. under the trademark 9440 Solder Resist or that sold by Shell under the trademark 828.

Each of the materials, silver, carboxylated vinyl, solvent and epoxy are weighed in clean stainless steel bowls. The vinyl is dissolved in the solvent to form a solution, to which the silver powder and the epoxy is added. The solution with the silver and epoxy may be blended with a mixer until the silver powder is thoroughly dispersed, thereby forming an ink. The silver should make up from 75 to 80% by weight of the ink with a preferred amount being 77.5%. The vinyl solution should make up from 10 to 13% by weight of the ink with a preferred amount being 11.8%. The vinyl vehicle is made up of the carboxylated vinyl powder and the solvent in a ratio of 30% vinyl to 70% solvent. The epoxy should make up from 9 to 11% by weight of the ink with a preferred amount being 9.7%.

The ink is then milled using a 3-roll mill until the desired fineness of grind is obtained. This may require 3 to 6 passes through the 3-roll mill to achieve a fineness of grind of 7 microns or less.

The viscocity of the ink may be lowered with the addition of more solvent in 0.1% by weight increment. A viscocity between 80,000 and 120,000 centipoise (cps) is desired for most applications. The ink may then be applied to any substrate capable of withstanding the curing temperature of the ink. For example, the ink may be screen printed onto circuit boards to connect one element of a circuit to another or to provide an electrical connection to another circuit. For this application the ink may be screen printed using conventional silk screening methods. Because of the high curing temperature of the ink, it is recommended that the ink be printed on an aluminum substrate.

The ink forms a film on the substrate which then must be cured. The film is cured by exposing the substrate to an ambient temperature from 345° to 355° centigrade (C.) for 8 to 12 minutes. The substrate may be placed in a convection oven for curing under these temperature and time conditions. The film may also be cured in a belt furnace at a temperature from 345° to 355° C. for a maximum of 10 minutes.

During curing the solvent is evaporated and polymerization occurs, leaving a hard, solderable, electrically conductive film made up of metallic silver particles, carboxylated vinyl and epoxy. It will readily be appreciated that the metal content of the cured film is greater than the metal content of the ink, as the solvent evaporates during curing.

The metallic silver particles make up from 82 to 88% by weight of the cured film with a preferred amount being 85%. The carboxylated vinyl makes up from 3.3 to 4.3% by weight of the cured film with a preferred amount being 3.8%. The epoxy makes up from 9.9 to 12% by weight of the cured film with a preferred amount being 10.6%.

The cured film provides excellent electrical conductivity having a resistivity of 0.0002 ohms per square per mil. Any size square of the cured film having a thickness of one mil will have a resistivity of 0.0002 ohms. In addition, the film exhibits solderability in that solder adheres to the film and as a result no plating or any subsequent coating operation is necessary. Solder may be applied by use of a soldering iron or any standard soldering technique. No special flux is required and standard activated rosin flux may be used. In addition, the cured film may be soldered by a solder dip process without leaching of the silver particles. In a solder dip process the substrate containing the film is dipped into a solder bath maintained at 200° C. The substrate may be left in the bath for 5 seconds and then removed. This operation has results in 100% coverage of the conductor with solder without the solder dissolving the silver particles off the substrate. In addition, the film adheres well to the substrate requiring 7 to 20 pounds of force to remove it therefrom. All of this is accomplished with a relatively short cure time of approximately 10 minutes.

As will be readily apparent to those skilled in the art, the invention may be used in other specific forms or for other purposes without departing from its spirit or central characteristics. The present embodiments are therefore to be considered as illustrative and not restrictive, the scope of the invention being indicated by the claims rather than by the foregoing description, and all embodiments which come within the range of equivalence of the claims are intended to be embraced.

We claim:

1. A method for forming a solderable electrically conductive film comprising the steps of dissolving carboxylated vinyl in a solvent to form a solution, mixing said solution with metallic silver particles and an moderate chain length epoxy to form an ink, applying said ink to a substrate to form a film thereon and applying heat to said film to evaporate said solvent to leave a solderable electrically conductive film on said substrate.

2. A method as in claim 1 in which said substrate is a circuit board and said ink is applied to said circuit board by screen printing.

3. A method as in claim 1 in which said substrate is formed from aluminum.

4. A method as in claim 1 in which said solution makes up approximately 11.8% by weight of said ink.

5. A method as in claim 4 in which said silver makes up approximately 77.5% by weight of said ink.

6. A method as in claim 5 in which said epoxy makes up approximately 9.7% by weight of said ink.

7. A method as in claim 6 in which said carboxylated vinyl powder makes up approximately 30% by weight of said solution.

8. A method as in claim 7 in which said solvent makes up approximately 70% by weight of said solution.

9. A method as in claim 8 in which said solvent is ester alcohol.

10. A method as in claim 1 in which said film is cured by providing a 350° C. ambient temperature for 10 minutes.

11. A method as in claim 10 in which the said film is cured in a belt furnace.

12. A method as in claim 1 in which said film is cured by providing an ambient temperature from 345° to 355° C. for 8 to 12 minutes.

13. A method as in claim 12 in which said curing takes place in a convection oven.

14. A method for forming a solderable electrically conductive film comprising the steps of dissolving carboxylated vinyl in a solvent to form a solution, mixing said solution with metallic silver particles and a moderate chain length epoxy to form an ink, in which said solution makes up from 10 to 13% by weight of said ink, said metallic silver particles make up from 75 to 80% by weight of said ink and said epoxy makes up from 9 to 11% by weight of said ink, applying said ink to a substrate to form a film thereon and applying heat to said film to evaporate said solvent to leave a solderable electrically conductive film on said substrate.

15. A method as in claim 14 in which said film is cured by providing a 350° C. ambient temperature for 10 minutes.

16. A method as in claim 15 in which the said film is cured in a belt furnace.

17. A method as in claim 14 in which said film is cured by providing an ambient temperature from 345° to 355° C. for 8 to 12 minutes.

18. A method as in claim 17 in which said curing takes place in a convection oven.

* * * * *